United States Patent [19]

Ouchi et al.

[11] Patent Number: 4,740,819
[45] Date of Patent: Apr. 26, 1988

[54] PHOTO SEMICONDUCTOR DEVICE

[75] Inventors: Hirobumi Ouchi, Hino; Hiroshi Matsuda, Hachioji; Makoto Morioka, Nishitama; Masahiko Kawata, Hachioji; Kazuhiro Kurata, Hachioji; Yasushi Koga, Hachioji, all of Japan

[73] Assignee: Hitachi, Ltd., Tokyo, Japan

[21] Appl. No.: 680,118

[22] Filed: Jun. 30, 1986

Related U.S. Application Data

[63] Continuation of Ser. No. 423,433, Sep. 24, 1982, abandoned.

[30] Foreign Application Priority Data

Oct. 2, 1981 [JP] Japan ................... 56-156282
Oct. 2, 1981 [JP] Japan ................... 56-156283

[51] Int. Cl.$^4$ .......................................... H01L 29/90
[52] U.S. Cl. .................................. 357/13; 357/30; 357/16; 357/52
[58] Field of Search ............... 357/16, 52, 13, 30 A, 357/30 B, 30 D, 30 E, 30 L

[56] References Cited

U.S. PATENT DOCUMENTS

| 3,993,506 | 11/1976 | Moon | 357/30 |
|---|---|---|---|
| 4,207,586 | 6/1980 | Lebailly | 357/52 |
| 4,213,138 | 7/1980 | Campbell et al. | 357/30 |
| 4,231,050 | 10/1980 | Casey, Jr. et al. | 357/16 |
| 4,233,090 | 11/1980 | Hawrylo et al. | 357/16 |
| 4,258,375 | 3/1981 | Hsieh et al. | 357/30 |
| 4,263,605 | 4/1981 | Christou et al. | 357/52 X |
| 4,287,485 | 9/1981 | Hsieh | 357/16 X |
| 4,328,508 | 5/1982 | Kressel et al. | 357/30 |
| 4,383,266 | 5/1983 | Sakai et al. | 357/52 |
| 4,383,267 | 5/1983 | Webb | 357/30 |
| 4,481,523 | 11/1984 | Osaka et al. | 357/30 |

FOREIGN PATENT DOCUMENTS 57-63867 4/1982 Japan .

OTHER PUBLICATIONS

Liu et al., Low Bandgap (.7 to 1.1 ev) Solar Cells in the GaAlSbAs/GaSb System, IEEE Conference 1980, (Jan. 7-10, 1980).
Nishida, K., Taguchi, K., & Matsumoto, Y., InGaAsP "Heterostructure Avalanche Photodiodes with High Avalanche Gain" Applied Phys. Lett. 35(3) Aug. 1979, pp. 251–252.

Primary Examiner—Andrew J. James
Assistant Examiner—Sara W. Crane
Attorney, Agent, or Firm—Antonelli, Terry & Wands

[57] ABSTRACT

Disclosed is a photo-detective semiconductor device having, on a predetermined semiconductor substrate, at least a first semiconductor layer which exhibits a first conductivity type, a second semiconductor layer which is disposed on said first semiconductor layer, which has a forbidden band gap greater than that of said first semiconductor layer and which exhibits the first conductivity type, and a p-n junction which is formed by a region disposed in said second semiconductor layer and exhibiting a second conductivity type; characterized by comprising a third semiconductor layer which is disposed on said second semiconductor layer, which exhibits the first conductivity type and which has a surface protective function. The third semiconductor layer is usually made of a group III-V compound semiconductor of a quaternary system. By way of example, in a case where the first semiconductor layer is formed of InGaAsP and where the second semiconductor layer is formed of InP, the third semiconductor layer is made of InGaAsP, InGaAs or the like. A photo-detective semiconductor device of low dark current can be provided.

6 Claims, 3 Drawing Sheets

PHOTO SEMICONDUCTOR DEVICE

This application is a continuing application of application Ser. No. 423,433, filed Sept. 24, 1982, now abandoned.

BACKGROUND OF THE INVENTION

1. Field of the Invention

The present invention relates to a photo-detective semiconductor device which is reverse-biased in operation. The device of the specified type is usually called a photodiode or an avalanche photodiode.

2. Description of the Prior Art

The photodiode or the avalanche photodiode is important as a photodetector in an optical communication system. Semiconductor lasers are used as light sources in the optical communication system. Regarding oscillation wavelengths of 0.8 μm–1.4 μm, the semiconductor lasers of, e.g., a GaAs-GaAlAs system and an InGaAsP-InP system are mainly employed.

As the photodetectors for these semiconductor lasers, ones made of the single crystal of Si are well known. However, they do not have a satisfactory sensitivity to light having wavelengths of and above 1 μm. As such photodetector for the optical communication, a photodetector employing a group III–V compound semiconductor material is requested. With the compound semiconductor material, however, it is the present situation that a satisfactory operation cannot be achieved because of, particularly, underdeveloped surface passivation technology.

Photosensors of mesa and planar structures as shown in FIGS. 1a and 1b are typical examples having hitherto been proposed. In the structure of FIG. 1a, a semiconductor layer 2 of a first conductivity type and a semiconductor layer 3 of a second conductivity type are formed on a semiconductor substrate 1, and electrodes 8 and 9 are further disposed. The mesa structure in FIG. 1a is undesirable in practical use in that, since a high electric field is exposed to the end face of a junction, the characteristics of the device are affected by the properties of a surface protective film. On the other hand, the planar structure in FIG. 1b (for example, Japanese Laid-open Patent Application No. 55-132079) is expected to attain a stable operation as compared with the operation of the mesa structure. In the structure of FIG. 1b, an n+-type InP layer 2, an InGaAsP layer 3 and an n-type InP layer 4 are formed on an InP semiconductor substrate 1. Shown at numeral 6 is a diffused layer of, e.g., Cd, the diffusion end face of which forms a p-n junction. Numeral 7 designates an insulating layer, and numerals 8 and 9 designate electrodes.

SUMMARY OF THE INVENTION

The present invention provides a photo-detective semiconductor device which is high in sensitivity and low in dark current, and for which a fast operation is satisfactorily ensured.

The foregoing example of FIG. 1b has been found to involve the following disadvantage:

In the heat-treatment step of a process for manufacturing the device after the crystal growth of the InP crystal, P (phosphorus) exhibiting a high vapor pressure dissociates and the property of the surface thereof changes. Therefore, the interface characteristics of this layer become unstable, and the dark current of the device increases.

The present invention eliminates such disadvantage.

The structure of the present invention consists in a photo-detective semiconductor device having, on a predetermined semiconductor substrate, at least a first semiconductor layer which exhibits a first conductivity type, a second semiconductor layer which is disposed on said first semiconductor layer, which has a forbidden band gap greater than that of said first semiconductor layer and which exhibits the first conductivity type, and a p-n junction which is formed by a region disposed in said second semiconductor layer and exhibiting a second conductivity type; characterized by comprising a third semiconductor layer which is disposed on said second semiconductor layer, which exhibits the first conductivity type and which has a surface protective function. The third semiconductor layer is usually made of a group III–V compound semiconductor of a quaternary system.

By way of example, in a case where the first semiconductor layer is formed of InGaAsP and where the second semiconductor layer is formed of InP, the third semiconductor layer is made of InGaAsP, InGaAs or the like. While the material InGaAs is a group III–V compound semiconductor of a ternary system, the composition is selected so that P in the first-mentioned material InGaAsP may not be contained.

In addition, in a case where the first semiconductor layer is formed of GaSb and where the second semiconductor layer is formed of GaAlSb, a material GaAlAsSb can be used for the third semiconductor layer.

In order to fabricate a more effective avalanche photodiode, the distance between the first semiconductor layer and the p-n junction formed in the second semiconductor layer ought to be set so that an electric field extending from the p-n junction into the first semiconductor layer may not become greater in intensity than the maximum electric field ($E_{ms}$) of the first semiconductor layer. The "maximum electric field" of a semiconductor layer is a property of which a semiconductor material itself is in possession, and it signifies an electric field at the breakdown of the tunnel effect or an electric field at the avalanche breakdown. This will be discussed in detail later.

DETAILED DESCRIPTION OF THE PREFERRED EMBODIMENTS

Figure 1A:
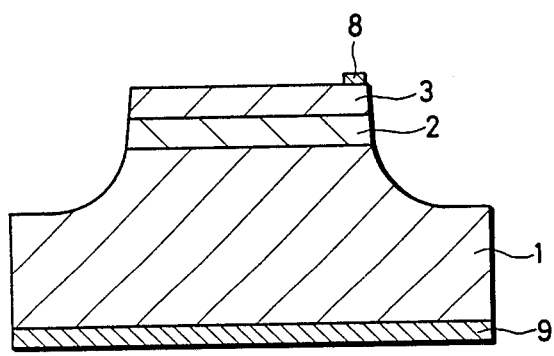
FIGS. 1a and 1b are sectional views showing examples of prior-art device structures, and illustrate mesa and planar structures respectively.
Figure 1B:
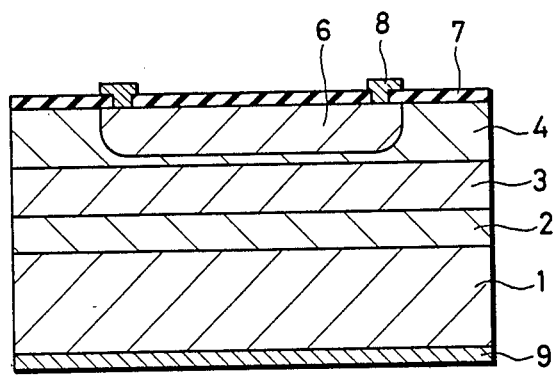
Figure 2:
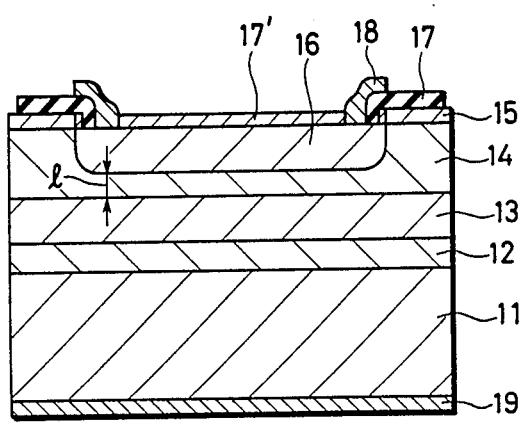
FIG. 2 is a sectional view of a device structure embodying the present invention.

The gist of the present invention consists in that, as shown in FIG. 2, a layer 14 (second semiconductor layer) of a substance of great forbidden band gap which is to act as an optical window layer is formed on a layer 13 (first semiconductor layer) of a substance of small forbidden band gap to act as an active region, and that a polyatomic layer 15 (third semiconductor layer) containing a constituent element of the substance of the layer 14 is formed and is overlaid with a surface protective film, thereby to achieve the stabilization between the semiconductor and an interface. A p-n junction is provided in the second semiconductor layer. Thus, the invention is characterized by a photosensor structure which can reduce dark current and stabilize the interface.

For the third semiconductor layer, a semiconductor material is used which has the properties (1) that it can establish lattice matching with the second semiconductor layer (for example, InP), (2) that it can assume the same crystal based system (for example, InP-based system) as that of the second semiconductor layer, and (3) that it is stabler than the second semiconductor layer when exposed to high temperatures.

The relation of $N_{14} \geq N_{13}$ holds between the impurity concentrations $N_{14}$ and $N_{13}$ of the respective substances of the region 14 and the region 13, and the concentration $N_{13}$ is set at, at most, $2 \times 10^{16}$ cm$^{-3}$.

The example of FIG. 2 will now be described in detail.

On an n$^+$-type InP substrate 11 having a high impurity concentration of at least about $10^{18}$ cm$^{-3}$, an n-type InP layer 12 having an impurity concentration of $9 \times 10^{15}$ cm$^{-3}$ and a thickness of 1.5 μm is formed by the well-known liquid phase epitaxial growth, and an n-type $In_{0.61}Ga_{0.39}As_{0.83}P_{0.17}$ layer 13 having an impurity concentration of $7 \times 10^{15}$ cm$^{-3}$ and a thickness of 1.3 μm is subsequently formed. In particular, in order to allow the device to receive light of wavelengths not shorter than 1.3 μm at a high sensitivity, preferably the material $In_{1-x}Ga_xAs_yP_{1-y}$ is set at a composition of $0.47 \geq x \geq 0.25$. The center value of the sensitivity is determined by the forbidden band gap of the semiconductor of this layer. The thickness of this layer is made 1 μm–5 μm or so, and is determined in accordance with the quantity of absorption of light required. Further, the As content is generally determined with the Ga content, and there is the following equation of the relation:

$$y = \frac{x}{0.48043 + 0.00327 x}$$

Subsequently, an n-type InP layer 14 having an impurity concentration of $9 \times 10^{15}$ cm$^{-3}$ and a thickness of 1.8 μm is formed, and lastly, an n-type $In_{0.9}Ga_{0.1}As_{0.2}P_{0.8}$ layer 15 having an impurity concentration of $7 \times 10^{15}$ cm$^{-3}$ and a thickness of 0.2 μm is formed. The layers 12 to 15 are continuous on the substrate 11. While the thickness of the layer 14 is determined by the diffusion depth of an impurity for forming a p-n junction, it is usually set at approximately 1.5–5 μm, more preferably 1.5 μm–3 μm. The semiconductor layer 15 is often made of $In_{1-x}Ga_xAs_yP_{1-y}$ where $0.05 \leq x \leq 0.47$ is held. In a range of $0.25 \leq x \leq 0.47$, this layer absorbs light, so that the incidence of light on a place where it is unnecessary can be simultaneously prevented. When the thickness of the layer 15 is 0.1 μm, the object of the present invention can be accomplished. This thickness is usually made at most 0.5 μm, more preferably at most 0.3 μm. Although the layer 15 may be thickened more from the standpoint of protecting the device, a step appears in the surface of the device, and it is unfavorable for the subsequent process for finishing up the device.

At the next step, $Al_2O_3$ and $SiO_2$ films are formed by the known chemical vapor deposition, whereupon the unnecessary parts of the $Al_2O_3$ and $SiO_2$ films are removed by the known selective photoetching. Further, the region 15 is selectively removed, and an impurity of Zn or Cd is introduced into the regions 14 and 15 by the known diffusion process employing the aforementioned insulators as a diffusing mask, to form a p$^+$-type diffused region 16 having a diffusion depth of 0.7 μm. The diffused layer 16 and the InP layer 14 form a p-n junction. The spacing between the plane of the p-n junction and the region 13 is 1.1 μm. After the insulating films used as the diffusion mask have been subsequently removed, an $SiO_2$ film is formed by a known method. When the unnecessary part of the $SiO_2$ film has been removed by the known selective photoetching, a surface protective film 17 is obtained. As the insulating film for protection, a film of $Al_2O_3$ or a composite film of $Al_2O_3$ and $SiO_2$ can also be employed. The thickness of the film is made 0.6–2 μm or so. As an antireflection film 17', the surface protective film is applied as it is. Alternatively, $SiO_2$ or $Si_3N_4$ having a thickness suitable for the antireflection film is formed again. The antireflection film may be formed by well-known means. Thereafter, a front surface electrode 18 and a rear surface electrode 19 are formed. In an example, this device was mounted on a stem, and an operation as a photodiode was noted.

Hereunder, the construction and operation of the present embodiment will be described. In the present embodiment, the region 13 of narrow forbidden band gap is sandwiched between the regions of wide forbidden band gaps, so that the incident light is absorbed in the region 13. In addition, the surface layer is formed of the InGaAsP layer of wide forbidden band gap and is overlaid with the insulating film for the surface protection. Therefore, characteristics at the interface are stabilized, and the device is well suited to the reduction of dark current. Moreover, the p-n junction is formed in a manner to be spaced from the region 13, and the impurity concentration profile is also taken into consideration. Therefore, the device maintains hard junction characteristics and is suited to collecting photo-excited carriers to the junction efficiently. In addition, since the spread of a depletion layer is set in consideration of an electric field distribution, the junction capacitance is reduced, so the device is suited to enhancing the operating speed.

When the device is reverse-biased, the depletion layer spreads in the regions 14 and 13 directly under the junction. For this reason, light up to the wavelength of a longer wavelength end corresponding to the forbidden band gap of the region 13 is efficiently absorbed, and generated holes are gathered to the p-n junction by a drift electric field. The main characteristics of this p-i-n photodiode manufactured by way of trial are a wavelength sensitivity region of 1.0–1.55 μm, a quantum efficiency of 65% (at 1.3 μm), a junction capacitance of 0.8 pF and a dark current of below 0.1 nA (at 10 V).

Figure 3:
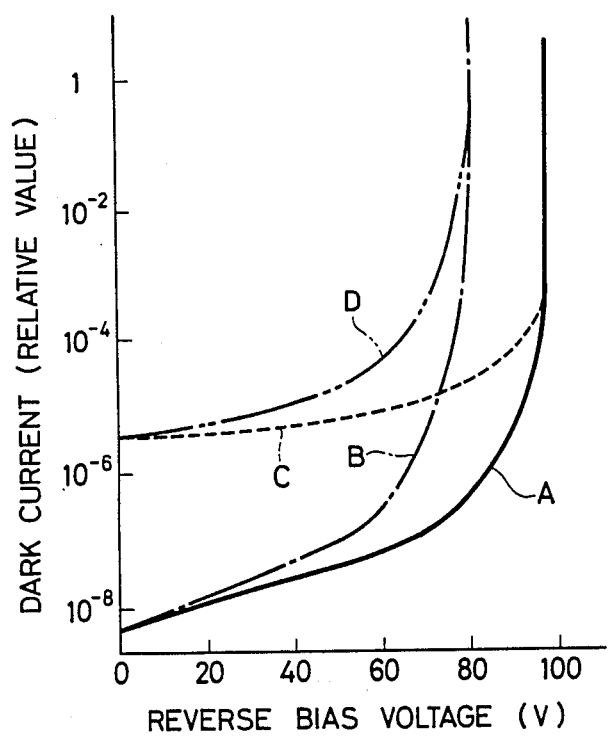
FIG. 3 is a graph in which the relationships between the reverse bias voltage and the dark current value are compared as to various photo-detective semiconductor devices.

FIG. 3 is a graph which illustrates the relationships between the reverse bias voltage and the dark current in order to clarify the effect of the present invention more. A curve A is a characteristic curve showing an example of the present invention. This example has a protective layer 15 of a quaternary compound semiconductor, and it has a p-n junction and a layer 13 having a spacing (l) of 1.5 μm therebetween and fulfills the foregoing condition that an electric field extending from the p-n junction does not exceed the maximum electric field of the first semiconductor layer. A curve B corresponds to an example which has a spacing (l) of 0.5 μm and does not satisfy the condition concerning the maximum electric field of the first semiconductor layer, and which has the protective layer 15 of the quaternary compound semiconductor. In this example, the reverse bias breakdown voltage is lower than in the example of the curve A, but a dark current at a low reverse bias voltage is low. Although this example is not optimized as an avalanche photodiode, it achieves the purpose of low dark current as a photodiode. On the other hand, a curve C corresponds to a comparative example, which has a spacing (l) of 1.5 μm and which does not include the protective layer 15 of the quaternary compound semiconductor. Also a curve D corresponds to a comparative example, which has a spacing (l) of 0.5 μm and which does not include the protective layer 15.

It is readily understood from FIG. 3 that the dark current is sharply reduced by the application of the present invention.

Figure 4:
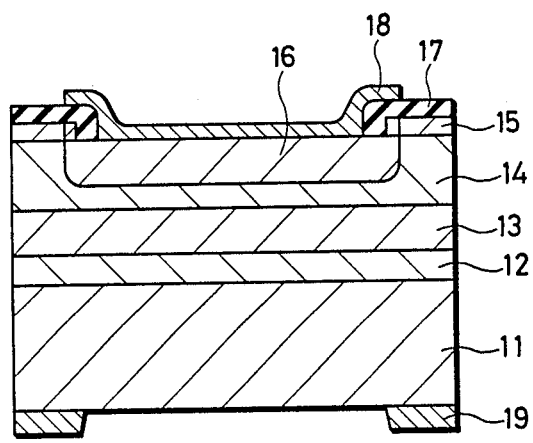
FIG. 4 is a sectional view of a device structure in another embodiment of the present invention.

As another embodiment, there is a case where light enters from the InP substrate side. FIG. 4 is a sectional view of a device showing this example. The same symbols as in FIG. 2 denote the same parts. The layer 15 is an InGaAsP layer for the surface protection. The points of difference from the embodiment in FIG. 2 is that the metal of the area of the electrode 19 located under the diffused region 16 is removed, and that the electrode 18 is provided on the whole surface because no incident light is required on this side. The others are the same as in the example of FIG. 2.

Now, how the semiconductor layers 13 and 14 and the p-n junction are disposed will be described in detail.

In case of applying the InP crystal as the substance of great forbidden band gap, it is considered that P exhibiting a high vapor pressure will dissociate in the heat-treatment step of a process for manufacturing the device after the growth of the crystal, so the property of the surface layer will change. Therefore, the interface characteristics after the formation of the surface protective film are unstable, which forms a cause for increase in the dark current.

Also the following fact forms the same cause.

In general, in semiconductor materials, as the effective mass and the forbidden band gap become smaller, and as the impurity concentration is lower, the electric field intensity at which breakdown is caused by the tunnel effect becomes lower. Therefore, in a case where the spacing l between the plane of the p-n junction formed in the region of great forbidden band gap (e.g., InP) and the region of small forbidden band gap (e.g., InGaAsP) is small, the electric field of the material of small forbidden band gap reaches a field intensity sufficient to cause the tunnel effect and gives rise to the tunnel breakdown before the p-n junction formed in the region of great forbidden band gap causes the avalanche multiplication effect. In general, the tunnel current can be expressed by the following equation:

$$J = \frac{(m^*)^{1/2} q^2 \epsilon \cdot E_m^3}{4\sqrt{2}\ \pi^2 h^{-2} N\ E_g^{2/}} \exp\left(-\frac{\pi (m^*)^{2/} E_g^{3/2}}{2\sqrt{2}\ q\bar{h}\ E_m}\right) \quad (1)$$

where
m*: effective mass,
q: elementary quantity of electric charge,
$\bar{h} = h/2\pi$: h being Planck's constant,
N: impurity concentration,
$E_g$: forbidden band gap,
$\epsilon$: dielectric constant, $E_m$: electric field intensity.

Assuming that the junction is stepped, the relationship between the electric field intensity and the operating voltage (tunnel breakdown voltage $V_T$) is given by the following equation:

$$V_T = \frac{\epsilon}{2qN} E_m^2 \quad (2)$$

On the other hand, the avalanche breakdown voltage $V_A$ is given by the following equation:

$$V_A = 60\left(\frac{E_g}{1.1}\right)^{3/2} \cdot \left(\frac{N}{10^{16}}\right)^{-3/4} \quad (3)$$

Now, when the p-n junction made of InGaAsP is taken as an example, impurity concentrations at $V_T = V_A$ are found as follows:

InP ($E_g$ for $\lambda \simeq 1.35$ μm): $\sim 3 \times 10^{17}$ cm$^{-3}$

In$_{0.79}$Ga$_{0.21}$As$_{0.47}$P$_{0.53}$ ($E_g$ for $\lambda \simeq 1.2$ μm): $\sim 2 \times 10^{16}$ cm$^{-3}$ In$_{0.75}$Ga$_{0.25}$As$_{0.56}$P$_{0.44}$ ($E_g$ for $\lambda \simeq 1.3$ μm): $\sim 7 \times 10^{15}$ cm$^{-3}$ In$_{0.61}$Ga$_{0.39}$As$_{0.83}$P$_{0.17}$ ($E_g$ for $\lambda \simeq 1.55$ μm): $\sim 8 \times 10^{14}$ cm$^{-3}$ Since $V_T > V_A$ is required in order to permit the avalanche multiplication effect to occur effectively, the impurity concentration needs to be lower than the aforementioned value. Accordingly, although the structure as shown in FIG. 2 moderates to some extent, restrictions to the impurity concentration of the material of small forbidden band gap with some values of the spacing l and the impurity concentration of the material of great forbidden band gap, it is important for expecting the avalanche multiplication effect that the relation of $V_T > V_A$ holds in the material of great forbidden band gap and that the maximum electric field $E_{ms}$ in the region of small forbidden band gap is lower than the electric field intensity $E_T$ at the tunnel breakdown (the electric field intensity $E_A$ at the avalanche breakdown, with some values of the impurity concentration). In order to meet the above conditions, at least the following relation needs to be satisfied among the spacing l and the respective impurity concentrations $N_L$ and $N_S$ of the material of large forbidden band gap and the material of small forbidden band gap:

$$\epsilon_L\left(E_{mL} - \frac{qN_L}{\epsilon_L} l\right) \leq \epsilon_S E_T \quad (4)$$

$$\therefore l \geq \frac{\epsilon_L}{qN_L}\left(E_{mL} - \frac{\epsilon_S}{\epsilon_L} E_T\right).$$

where
$E_{mL}$: the maximum electric field intensity of the material of great forbidden band gap,
$\epsilon_L$, $\epsilon_S$: the dielectric constants of the materials of great and small forbidden band gaps. Therefore, $N_L$, l and $E_T$ have the mutual relations, and as $N_L$ and $N_S$ are smaller, l needs to be increased more. For example, in a case where $N_L = 1 \times 10^{16}$ cm$^{-3}$ and $N_S = 2 \times 10^{16}$ cm$^{-3}$, l becomes at least about 1.5 μm for InGaAsP of λ=1.55 μm.

On the other hand, in case of fabricating the photodiode of the structure of FIG. 2, the maximum electric field during the operation becomes low, but the impurity concentration of the region of small forbidden band gap needs to be limited. When the depletion layer has spread by W in the region of small forbidden band gap, the electric field intensity $E_S$ of the material of small forbidden band gap on the side of the material of great forbidden band gap is given by the following equation:

$$E_S = \frac{q N_S}{\epsilon_S} W \quad (5)$$

Assuming that the depletion layer is (l+W) and that W is 1 μm, the impurity concentration $N_S$ needs to be made smaller than the undermentioned value in order to prevent $E_S$ from exceeding $E_T$.

$$N_S: \leq \text{about } 1 \times 10^{16} \text{ cm}^{-3} \text{ for } \lambda = 1.55 \text{ μm},$$
$$\leq \text{about } 2 \times 10^{16} \text{ cm}^{-3} \text{ for } \lambda = 1.3 \text{ μm}.$$

As stated above, the relation between $E_g$ and $N_S$ of the material must be considered. In a compound semiconductor, the lifetime of photo-excited carriers is much shorter than in Si. Therefore, in order to raise the photoelectric conversion efficiency, the light absorbing region needs to be depleted, and in order to render the operation fast, the depletion layer needs to be expanded for diminishing the junction capacitance C. The junction capacitance is approximately given by the following equation:

$$C \simeq \frac{\epsilon}{l + W} S \quad (6)$$

where
ε: dielectric constant,
S: junction area. In view of the quantum efficiency demanded in practical use (≧50%) and the junction capacitance (≦2 pF), it is considered that the depletion layer W spreads by approximately 1 μm.

The effects of the present embodiment will be listed below.

(a) By utilizing the characteristics of the interface between the InGaAsP layer and the insulating film, the dark current can be reduced.

(b) Owing to the layer construction as stated before, the increase of the dark current attributed to the tunnel effect can be prevented.

(c) Owing to the layer construction as stated before, the photo-excited carriers can be efficiently collected to the junction, and the sensitivity of the device can be enhanced.

(d) Owing to the layer construction as stated before, the photo-excited carriers can be collected to the junction at the drift velocity, and the operating speed of the device can be raised.

(e) Owing to the layer construction as stated before, the width of the depletion layer can be made great, so that the junction capacitance can be lowered, which is effective to raise the operating speed of the device.

While, in the above, the materials of the InP-InGaAsP system have been exemplified, the material system is not restricted thereto.

A similar photo-detective semiconductor device can be realized even when, for example, a material system is used which contains GaSb principally and which employs GaAlSb as the layer 14, GaSb as the layer 13, GaSb as the layer 12 and GaAlAsSb as the layer 15.

What is claimed is:

1. A photo semiconductor device comprising at least a first semiconductor layer, made of InGaAsP, which exhibits a first conductivity type; a second semiconductor layer, made of InP, which is disposed on said first semiconductor layer, which has a forbidden band gap greater than that of said first semiconductor layer and which exhibits the first conductivity type; a p-n junction which is formed by an impurity region disposed in said second semiconductor layer and exhibiting a second conductivity type, an edge of which p-n junction extends at least to a surface of said second semiconductor layer opposite the surface adjacent the first semiconductor layer; a third semiconductor layer, made of at least one selected from the group consisting of InGaAsP and InGaAs, which is disposed on said second semiconductor layer and which is formed above at least part of the edge of the p-n junction extending to said surface of said second semiconductor layer, which third semiconductor layer exhibits the first conductivity type and which third semiconductor layer is made of a material matching the lattice structure of the second semiconductor layer, having the same crystal based system as that of the second semiconductor layer, and being more stable at high temperatures than the material of the second semiconductor layer, said third semiconductor layer acting as a protective layer for the device; and an insulating film which is disposed on said third semiconductor layer, whereby a device having reduced dark current, as compared to that of a photo semiconductor device not having said third semiconductor layer, is achieved.

2. A photo semiconductor device according to claim 1, wherein said insulating film is selected from the group consisting of a SiO$_2$ film, an Al$_2$O$_3$ film, and a composite film of Al$_2$O$_3$ and SiO$_2$.

3. A photo semiconductor device according to claim 1, wherein the third semiconductor layer is made of In$_{1-x}$Ga$_x$As$_y$P$_{1-y}$, where 0.47>x>0.25, and $$y = \frac{x}{0.48043 + 0.00327 x}.$$

4. A photo semiconductor device comprising at least a first semiconductor layer which exhibits a first conductivity type; a second semiconductor layer which is disposed on said first semiconductor layer, which has a forbidden band gap greater than that of said first semiconductor layer and which exhibits the first conductivity type; a p-n junction which is formed by an impurity region disposed in said second semiconductor layer and exhibiting a second conductivity type, an edge of which p-n junction extends at least to a surface of said second semiconductor layer opposite the surface adjacent the first semiconductor layer; a third semiconductor layer which is disposed on said second semiconductor layer and which is formed above at least part of the edge of the p-n junction extending to the surface of said second semiconductor layer, a forbidden band gap of which third semiconductor layer is smaller than that of said second semiconductor layer so as to absorb unnecessary light, which third semiconductor layer is made of a material matching the lattice structure of the second semiconductor layer, having the same crystal based system as that of the second semiconductor layer, and being more stable at high temperatures than the material of the second semiconductor layer, and which third semiconductor layer exhibits the first conductivity type, said third semiconductor layer acting as a protective layer for the device, said edge of the p-n junction extending through the third semiconductor layer to the surface of the third semiconductor layer opposite to the surface thereof adjacent the second semiconductor layer; and an insulating film which is disposed on said third semiconductor layer, whereby a device having reduced dark current, as compared to that of a photo semiconductor device not having said third semiconductor layer, is achieved.

5. A photo semiconductor device according to claim 4, wherein said device is a photo-detective semiconductor device.

6. A photo semiconductor device according to claim 4, wherein said same crystal based system is a system containing constituent elements of said second semiconductor layer.

* * * * *

UNITED STATES PATENT AND TRADEMARK OFFICE
CERTIFICATE OF CORRECTION

PATENT NO. : 4,740,819

DATED : April 26, 1988

INVENTOR(S) : Ouchi, et al

It is certified that error appears in the above-identified patent and that said Letters Patent is hereby corrected as shown below:

On the title page, Item [21], delete "680,118" and substitute therefore --880,118--.

Signed and Sealed this

Thirty-first Day of December, 1991

Attest:

HARRY F. MANBECK, JR.

*Attesting Officer*  *Commissioner of Patents and Trademarks*